(12) United States Patent
Xiang et al.

(10) Patent No.: US 11,244,609 B2
(45) Date of Patent: Feb. 8, 2022

(54) DISPLAY DEVICE AND OLED DISPLAY PANEL THEREOF

(71) Applicant: KunShan Go-Visionox Opto-Electronics Co., Ltd., Kunshan (CN)

(72) Inventors: Dong Xiang, Kunshan (CN); Wenzhi Fan, Kunshan (CN); Junhui Lou, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 17/165,175

(22) Filed: Feb. 2, 2021

(65) Prior Publication Data
US 2021/0158750 A1    May 27, 2021

Related U.S. Application Data

(63) Continuation of application No. PCT/CN2019/098144, filed on Jul. 29, 2019.

(30) Foreign Application Priority Data

Jan. 31, 2019    (CN) .......................... 201910101116.7

(51) Int. Cl.
*G09G 3/3225*    (2016.01)
*G09G 3/3266*    (2016.01)
(Continued)

(52) U.S. Cl.
CPC ......... *G09G 3/3225* (2013.01); *G09G 3/3266* (2013.01); *H01L 27/3262* (2013.01);
(Continued)

(58) Field of Classification Search
CPC .. G09G 3/3225; G09G 3/3266; G09G 3/3233; G09G 2300/046; H01L 27/3262;
(Continued)

(56) References Cited

U.S. PATENT DOCUMENTS 10,872,571 B2 * 12/2020 Noh ..................... G09G 3/3233
10,910,572 B2 *  2/2021 Park ..................... H01L 27/3276
(Continued)

FOREIGN PATENT DOCUMENTS

| CN | 104465715 A | 3/2015 |
| CN | 105679199 A | 6/2016 |

(Continued)

OTHER PUBLICATIONS

Office Action and Search Report dated May 11, 2020 in corresponding Chinese application No. 201910101116.7; 17 pages.
(Continued)

*Primary Examiner* — Sardis F Azongha
(74) *Attorney, Agent, or Firm* — Maier & Maier, PLLC

(57) ABSTRACT

A display device and an OLED display panel thereof. The OLED display panel includes a non-transparent display area including first OLED pixels, a transparent display area including second OLED pixels, a display driving chip, a first gate driving circuit group. For a same of image, a pulse width of the second gate driving signal for the second OLED pixels is substantially the same as a pulse width of the first gate driving signal for the first OLED pixels; and intersection points of a boundary line and a pixel row where the first OLED pixels in a specified row are located falls within a range of intersection points of the boundary line and a corresponding pixel row of the second OLED pixels.

19 Claims, 9 Drawing Sheets

(51) Int. Cl.
*H01L 27/32* (2006.01)
*H01L 51/52* (2006.01)

(52) U.S. Cl.
CPC ...... *H01L 27/3276* (2013.01); *H01L 51/5253* (2013.01); *H01L 51/5293* (2013.01); *G09G 2300/0426* (2013.01); *G09G 2300/0452* (2013.01); *G09G 2310/0221* (2013.01); *G09G 2310/08* (2013.01); *G09G 2320/0233* (2013.01); *G09G 2330/02* (2013.01); *G09G 2360/14* (2013.01)

(58) Field of Classification Search
CPC ............ H01L 27/3276; H01L 51/5253; H01L 51/5293
See application file for complete search history.

(56) References Cited

U.S. PATENT DOCUMENTS

| | | | |
|---|---|---|---|
| 10,978,447 | B2* | 4/2021 | Kim ................... H01L 27/3276 |
| 2008/0261057 | A1 | 10/2008 | Slobodin |
| 2013/0135328 | A1 | 5/2013 | Rappoport et al. |
| 2018/0158417 | A1 | 6/2018 | Xiang et al. |
| 2018/0190190 | A1 | 7/2018 | Xi et al. |
| 2018/0260079 | A1 | 9/2018 | Zhang |
| 2020/0006403 | A1* | 1/2020 | Chen ................... G06K 9/2027 |
| 2020/0052048 | A1* | 2/2020 | Kuo ..................... G06F 1/1626 |
| 2020/0194730 | A1* | 6/2020 | Park ................... H01L 27/3223 |

FOREIGN PATENT DOCUMENTS

| | | | |
|---|---|---|---|
| CN | 106055162 | A | 10/2016 |
| CN | 106878564 | A | 6/2017 |
| CN | 106920470 | A | 7/2017 |
| CN | 107564470 | A | 1/2018 |
| CN | 107610635 | A | 1/2018 |
| CN | 107610645 | A | 1/2018 |
| CN | 207264695 | U | 4/2018 |
| CN | 108376696 | A | 8/2018 |
| CN | 108389879 | A | 8/2018 |
| CN | 207947006 | U | 10/2018 |
| CN | 109143670 | A | 1/2019 |
| KR | 20170024182 | A | 3/2017 |

OTHER PUBLICATIONS

Office Action dated Jul. 16, 2020 in corresponding Chinese application No. 201910101116.7; 17 pages.
Office Action and Search Report dated Sep. 28, 2020 in corresponding Taiwanese application No. 108129070; 9 pages including Partial English-language translation.
International Search Report dated Oct. 28, 2019 in corresponding International application No. PCT/CN2019/098144; 6 pages.
Written Opinion of the International Searching Authority dated Oct. 28, 2019 in corresponding International application No. PCT/CN2019/098144; 7 pages.

* cited by examiner

DISPLAY DEVICE AND OLED DISPLAY PANEL THEREOF

CROSS-REFERENCE TO RELATED APPLICATIONS

This application is a continuation application of International Application No. PCT/CN2019/098144 filed on Jul. 29, 2019, which claims priority to Chinese patent application No. 201910101116.7 filed on Jan. 31, 2019. Both applications are incorporated herein by reference in their entireties.

TECHNICAL FIELD

This application relates to the technical field of OLED display devices, and in particular to a display device and an OLED display panel thereof.

BACKGROUND

With the rapid development of display devices, users have increasingly higher requirements for the screen-to-body ratio. Since components such as a camera, a sensor, an earpieces, etc., are to be installed at a top portion of a screen, a part area of the top portion of the screen, for example, the notch area of the iPhone X, is usually reserved for installing the above components, which affects the overall consistency of the screen. At present, the full-screen display is receiving more and more attention from the industry.

SUMMARY

The present application provides a display device and an OLED display panel thereof.

A first aspect of the present application provides an OLED display panel. The OLED display panel includes a display area, a display driving chip and a first gate driving circuit group. The display area includes a non-transparent display area including first OLED pixels arranged in an array, and the first OLED pixels arranged in an array being drivable in an active mode; and a transparent display area, a boundary line being disposed between the non-transparent display area and the transparent display area. The transparent display area includes second OLED pixels arranged in an array. When the second OLED pixels arranged in an array are driven, the transparent display area performs a display function; when the second OLED pixels arranged in an array are not driven, the transparent display area performs a light transmission function; and the second OLED pixels arranged in an array are drivable in an active mode. The first gate driving circuit group is connected to a first group of gate driving signal channels of the display driving chip. The first pixel driving circuits corresponding to the first OLED pixels in each row in the non-transparent display area are respectively connected to the first gate driving circuit group, and second pixel driving circuits of the second OLED pixels in each row in the transparent display area are respectively connected to a second group of gate driving signal channels of the display driving chip. The display driving chip is configured to output a first set of clock signals through the first group of gate driving signal channels, and the first gate driving circuit group is configured to convert the first set of clock signals into a first gate driving signal for the first pixel driving circuits corresponding to the first OLED pixels in each row. The display driving chip is further configured to output a second gate driving signal for the second pixel driving circuits of the second OLED pixels in each row through the second group of gate driving signal channels. For a same frame of image, a pulse width of the second gate driving signal for the second OLED pixels in each row is substantially the same as a pulse width of the first gate driving signal for the first OLED pixels in a specified row; and intersection points of the boundary line and a pixel row where the first OLED pixels in the specified row are located falls within a range of intersection points of the boundary line and a corresponding pixel row of the second OLED pixels.

A second aspect of the present application provides a display device. The display device includes a device body including a component area; and the OLED display panel according to the above aspect, the OLED display panel covering the device body. The component area is located beneath the transparent display area, and the component area includes a light sensing component that emits or collects light through the transparent display area.

The beneficial effects of embodiments of the present application may include the follows. The first pixel driving circuits corresponding to the first OLED pixels in each row of the non-transparent display area are respectively connected to the first gate driving circuit group, the first gate driving circuit group is connected to the first group of gate driving signal channels of the display driving chip, and the second pixel driving circuits of the second OLED pixels in each row in the transparent display area are respectively connected to the second group of gate driving signal channels of the display driving chip. The display driving chip outputs the first set of clock signals through the first group of gate driving signal channels, and the first gate driving circuit group converts the first set of clock signals into the first gate driving signal for the first pixel driving circuits corresponding to the first OLED pixels in each row. The display driving chip also outputs the second gate driving signal for the second pixel driving circuits of the second OLED pixels in each row through the second group of gate driving signal channels. And, for the same frame of image, the pulse width of the second gate driving signal for the second OLED pixels in each row is substantially the same as the pulse width of the first gate driving signal for the first OLED pixels in the specified row. The intersection points of the pixel row where the first OLED pixels in the specified row are located and the boundary line falls within the range of the intersection points of the corresponding pixel row of the second OLED pixels and the boundary line. In this way, the first OLED pixels and the second OLED pixels horizontally aligned can perform displaying synchronously, and the light-emitting brightness thereof is substantially the same, thereby realizing the synchronous display of the non-transparent display area and the transparent display area, reducing or even avoiding the split-screen phenomenon occurred in areas on both sides of the boundary line between the non-transparent display area and the transparent display area.

It should be understood that the above general description and the following detailed description are only exemplary and explanatory, and cannot limit the application.

DETAILED DESCRIPTION OF THE EMBODIMENTS

Figure 1:
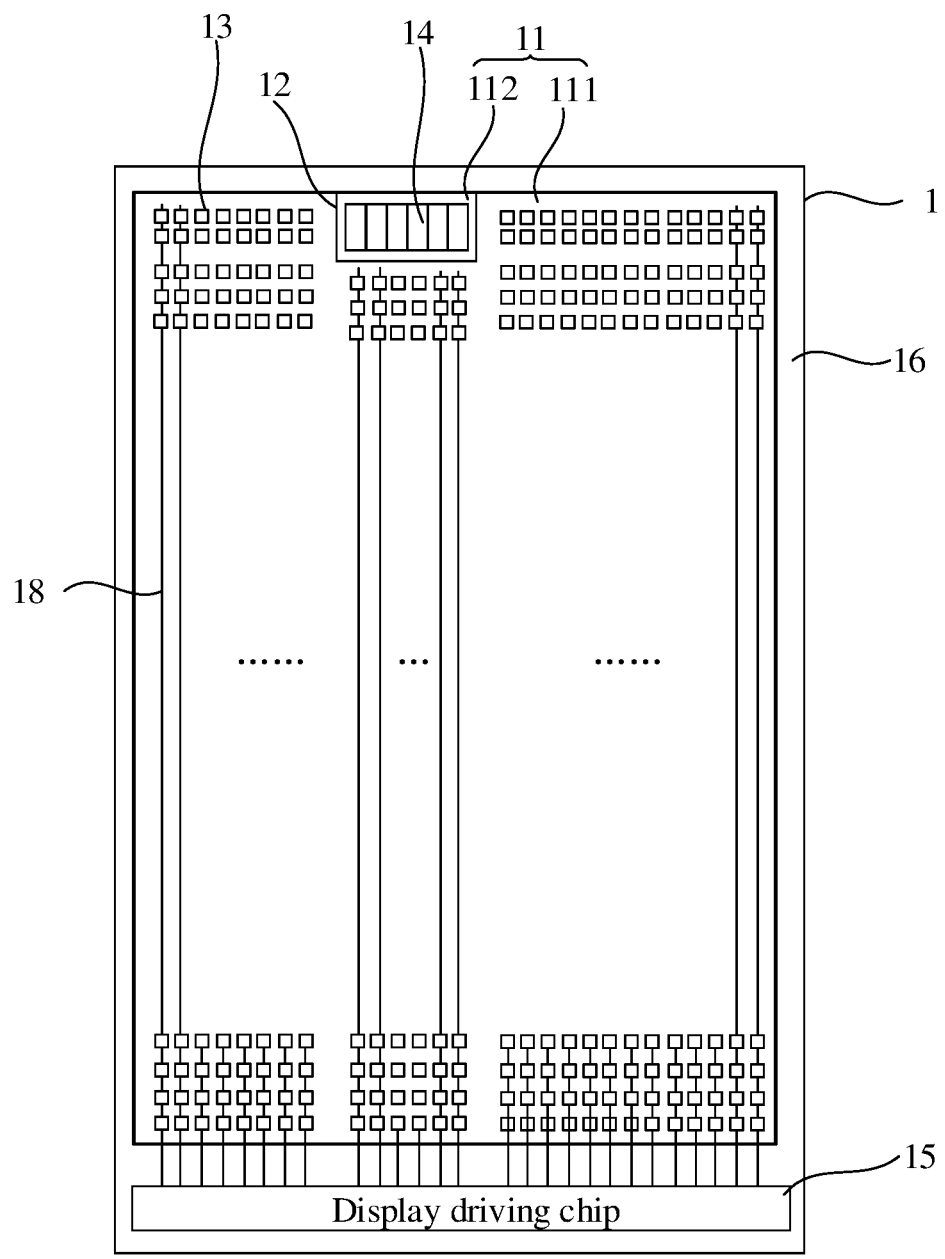
FIG. 1 is a schematic structural diagram of an OLED display panel according to an embodiment of the present application.

Examples will be described in detail herein, with the illustrations thereof represented in the drawings. When the following descriptions refer to the drawings, unless otherwise indicated, like numerals in different drawings represent the like or similar elements. The implementation manners described in the following exemplary embodiments do not represent all implementation manners consistent with the present application. On the contrary, they are merely examples of devices and methods consistent with some aspects of the application as detailed in the appended claims.

There is known a full screen including a transparent display area and a non-transparent display area. The transparent display area can realize both a light transmission function and a display function. However, the transparent display area and the non-transparent display area are often out of synchronization in displaying, which leads to a problem of split screen.

In view of the above technical problems, at least one embodiment of the present application provides a display device and an OLED (Organic Light-Emitting Diode) display panel thereof, which can realize the synchronous display of the non-transparent display area and the transparent display area, and reduce or even avoid the split-screen phenomenon in areas on both sides of a boundary line between the non-transparent display area and the transparent display area.

An embodiment of the present application provides an OLED display panel. As shown in FIGS. 1 to 4, the OLED display panel 1 includes a display area 11, and the display area 11 includes a non-transparent display area 111 and a transparent display area 112.

As shown in FIG. 1, there is a boundary line 12 between the non-transparent display area 111 and the transparent display area 112. The split-screen phenomenon to be avoided in this embodiment is a split-screen phenomenon that occurs in areas on both sides of the boundary line 12. The non-transparent display area 111 includes first OLED pixels 13 arranged in an array, and the first OLED pixels 13 arranged in an array are drivable in an active mode. The transparent display area 112 includes second OLED pixels 14 arranged in an array. When the second OLED pixels 14 arranged in an array are driven, the transparent display area 112 performs a display function. When the second OLED pixels 14 arranged in an array are not driven, the transparent display area 112 performs a light transmission function. The second OLED pixels 14 arranged in an array are drivable in an active mode. For example, a bezel area 16 is provided around the display area 11. A display driving chip 15 is arranged in a lower part of the bezel area 16.

Figure 2A:
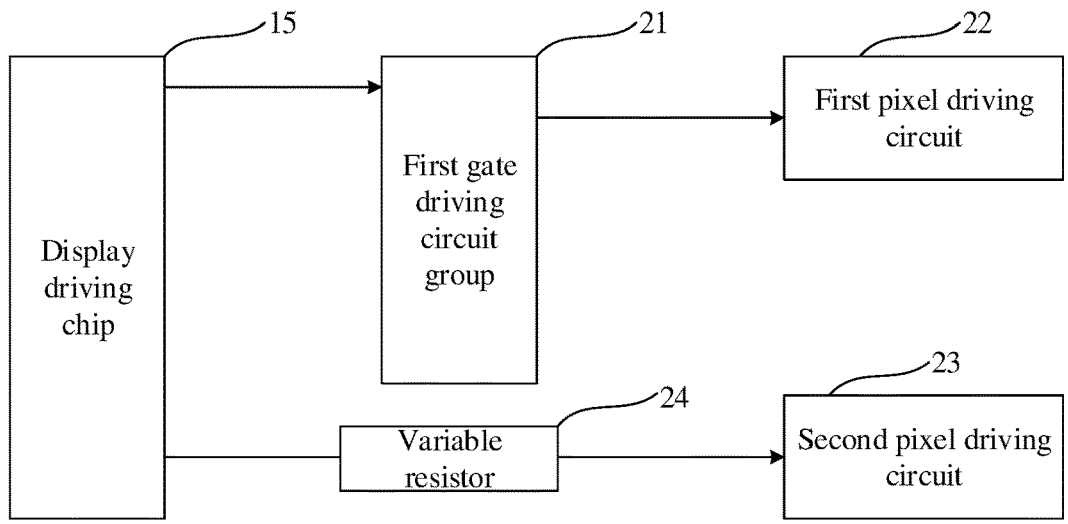
FIG. 2A is a block diagram showing a principle of a gate driving circuit according to an embodiment of the present application.

As shown in FIG. 2A, in this embodiment, first pixel driving circuits 22 corresponding to rows of the first OLED pixels 13 are respectively connected to a first gate driving circuit group 21. The first gate driving circuit group 21 is connected to a first group of gate driving signal channels (not shown) of the display driving chip 15. Second pixel driving circuits 23 corresponding to rows of the second OLED pixels 14 are respectively connected to a second group of gate driving signal channels (not shown) of the display driving chip 15. The display drive chip 15 is configured to output a first set of clock signals through the first group of gate driving signal channels, and the first gate driving circuit group is configured to convert the first set of clock signals into a first gate driving signal for the first pixel driving circuits 22 corresponding to the first OLED pixels in each row. The display driving chip 15 is also configured to output a second gate driving signal of the second pixel driving circuits 23 corresponding to the second OLED pixels 14 in each row through the second group of gate driving signal channels.

Figure 3:
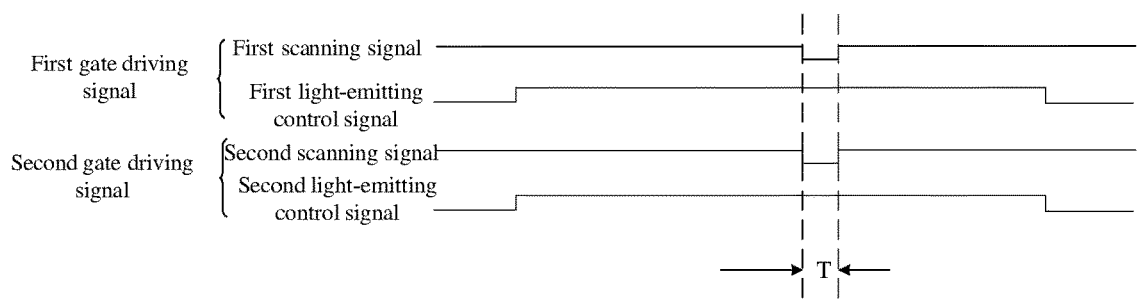
FIG. 3 is a schematic diagram showing first gate driving signals and second gate driving signals according to an embodiment of the present application.

As shown in FIG. 3, for a same frame of image, a pulse width T of the second gate driving signal for the second OLED pixels 14 in each row is substantially the same as a pulse width T of the first gate driving signal for the first OLED pixels 13 in a specified row.

Figure 4:
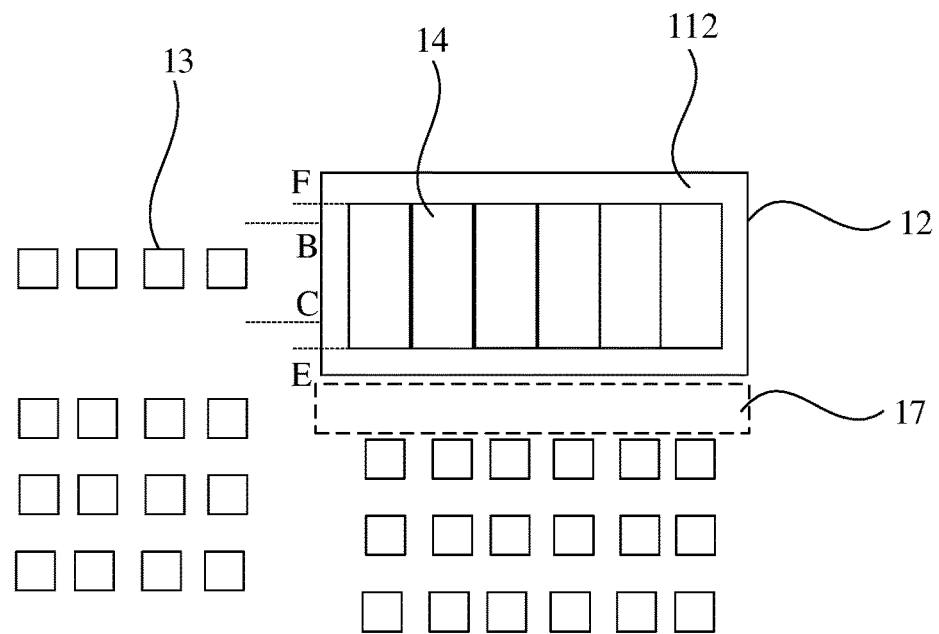
FIG. 4 is a schematic diagram showing positional relationship between first OLED pixels and second OLED pixels according to an embodiment of the present application.

As shown in FIG. 4, intersection points B and C of a pixel row where the first OLED pixels 13 in the specified row are located and the boundary line 12 falls within a range of intersection points E and F of a pixel row where the second OLED pixels 14 of the transparent display area 112 are located and the boundary line 12.

Figure 5:
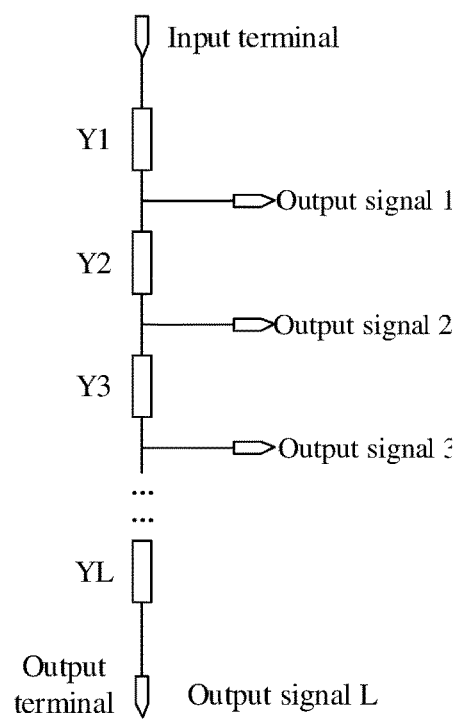
FIG. 5 is a schematic structural diagram of a first gate driving circuit group according to an embodiment of the present application.

Specifically, the display driving chip 15 includes the first group of gate driving signal channels and the second group of gate driving signal channels. The first group of gate driving signal channels is configured to output the first set of clock signals to the first gate driving circuit group. As shown in FIG. 5, the first gate driving circuit group may include shift registers Y1, Y2, Y3, . . . , YL connected in series in sequence. An input terminal of the shift register Y1 at a head end is configured to receive the first set of clock signals and perform a shift operation on the first set of clock signals, so as to obtain an output signal 1. The output signal 1 may include a first gate driving signal for first OLED pixels in first row in the non-transparent display area. The shift register Y1 further inputs the output signal 1 into the shift register Y2, and the shift register Y2 performs a shift operation on the output signal 1 to obtain an output signal 2. The output signal 2 can be the first gate driving signal for the first OLED pixels in a second row in the non-transparent display area. So on so forth, the output signal L output from an output terminal of the shift register YL is the first gate driving signal for the first OLED pixels in an Lth row.

In this embodiment, the first pixel driving circuits corresponding to rows of the first OLED pixels in the non-transparent display area are respectively connected to the first gate driving circuit group which is connected to the first group of gate driving signal channels of the display driving chip, and the second pixel driving circuits corresponding to rows of the second OLED pixels in the transparent display area are respectively connected to the second group of gate driving signal channels of the display driving chip. The display driving chip outputs the first set of clock signals through the first group of gate driving signal channels, and the first gate driving circuit group converts the first set of clock signals into the first gate driving signal for the first pixel driving circuits corresponding to the first OLED pixels in each row. The display driving chip also outputs the second gate driving signal of the second pixel driving circuits of the second OLED pixels in each row through the second group of gate driving signal channels. And, in the same frame of image, the pulse width of the second gate driving signal for the second OLED pixels in each row is substantially the same as the pulse width of the first gate driving signal for the first OLED pixels in the specified row. The intersection points of the pixel row where the first OLED pixels in the specified row are located and the boundary line fall within the range of the intersection points of the pixel row where the second OLED pixels of the transparent display area are located and the boundary line. In this way, the first OLED pixels and the second OLED pixels horizontally aligned can perform displaying synchronously, and the light-emitting brightness thereof is substantially the same, thereby realizing the synchronous display of the non-transparent display area and the transparent display area, reducing or even avoiding the split-screen phenomenon occurred in areas on both sides of the boundary line between the non-transparent display area and the transparent display area.

In one embodiment, as shown in FIG. 3, for the second OLED pixels 14 in the same row and the corresponding first OLED pixels 13 in the specified row, the first gate driving signal for the first OLED pixels 13 in the specified row includes a first scanning signal and a first light-emitting control signal, and the second gate driving signal for the second OLED pixels 14 in the same row includes a second scanning signal and a second light-emitting control signal. The first scanning signal and the second scanning signal are substantially the same, and the first light-emitting control signal is substantially the same as the second light-emitting control signal.

Since the first scanning signal and the second scanning signal are substantially the same, the time for writing data to storage capacitors in the first pixel driving circuit and the second pixel driving circuit is substantially the same, so that the second OLED pixels in the same row has substantially the same light-emitting brightness as the corresponding first OLED pixels in the specified row, which is beneficial to reduce or even avoid the split-screen phenomenon in the areas on both sides of the boundary line between the non-transparent display area and the transparent display area. Since the first light-emitting control signal is substantially the same as the second light-emitting control signal, the second OLED pixels in the same row and the corresponding first OLED pixels in the specified row can emit light synchronously, so as to realize the synchronous display of the non-transparent display area and the transparent display area.

As long as a difference between the light-emitting brightness of the first OLED pixels caused by the first scanning signal and the light-emitting brightness of the second OLED pixels caused by the second scanning signal is less than a specified brightness value, the first scanning signal and the second scanning signal can be considered to be substantially the same. The above specified brightness value may be 3% of the light-emitting brightness of the first OLED pixels.

In one embodiment, the first pixel driving circuit may be an nT1C pixel driving circuit, and the nT1C pixel driving circuit includes at least one first switching transistor configured to control the first OLED pixels 13 to emit light, where n is a positive integer greater than 2. The second pixel driving circuit is an mT1C pixel driving circuit, and the mT1C pixel driving circuit includes at least one second switching transistor configured to control the second OLED pixels to emit light, where m is a positive integer greater than 2.

Since the first pixel driving circuit is an nT1C pixel driving circuit, and the nT1C pixel driving circuit includes at least one first switching transistor configured to control the light emission of the first OLED pixels, a gate of one of the at least one first switching transistor is input with the first scanning signal, and a gate of another one of the at least one first switching transistor is input with the first light-emitting control signal. In this way, the first OLED pixels may be prohibited from emitting light when writing data to the storage capacitor in the first pixel driving circuit, and at the same time, interference to writing of data to the storage capacitor in the first pixel driving circuit by the light emission of the first OLED pixels may be prevented. Similarly, since the second pixel driving circuit is an mT1C pixel driving circuit, and the mT1C pixel driving circuit includes at least one first switching transistor configured to control the light emission of the second OLED pixels, a gate of one of the at least one second switching transistor is input with the second scanning signal, and a gate of another one of the at least one second switching transistor is input with the second light-emitting control signal. In this way, the second OLED pixels may be prohibited from emitting light when writing data to the storage capacitor in the second pixel driving circuit, and at the same time, interference to writing of data to the storage capacitor in the second pixel driving circuit by the light emission of second OLED pixels may be prevented.

Figure 6:
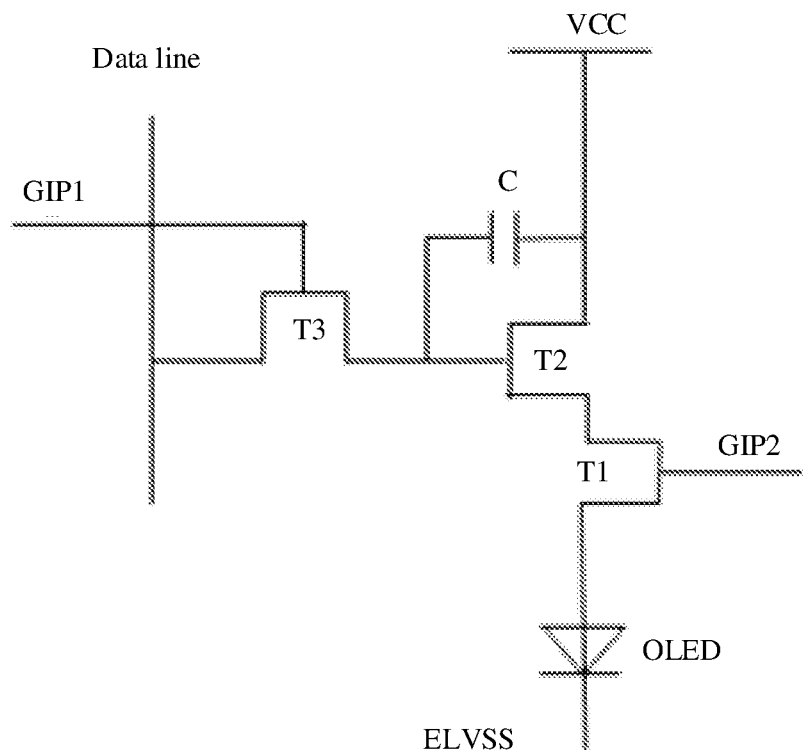
FIG. 6 shows a 3T1C pixel driving circuit according to an embodiment of the present application.

In one embodiment, m is equal to 3. As shown in FIG. 6, the second pixel driving circuit is a 3T1C pixel driving circuit, and the 3T1C pixel driving circuit includes two second switching transistors T1, T3, a storage capacitor C, and a driving transistor T2. A source of the second switching transistor T3 is connected to a data line, a gate thereof is configured to be input with the second scanning signal GIP1, and a drain thereof is connected to an electrode plate of the storage capacitor C and a gate of the driving transistor T2. A source of the driving transistor T2 is connected to the other electrode plate of the storage capacitor C and a power supply VCC. A drain of the driving transistor T2 is connected to a source of the second switching transistor T1. A drain of the second switching transistor T1 is connected to an anode of the OLED, and a gate of the second switching transistor T1 is configured to be input with a second light-emitting control signal GIP2. A cathode of the OLED is connected to a low level ELVSS.

Since the second pixel driving circuit is a 3T1C pixel driving circuit, the second OLED pixels in the same row and the corresponding first OLED pixels in the specified row can emit light synchronously, and the non-transparent display area and the transparent display area can perform displaying simultaneously. Besides, the structure is simple, the footprint is small, and the production is convenient.

In another embodiment, the first pixel driving circuit is a 2T1C pixel driving circuit; and the second pixel driving circuit is a 2T1C pixel driving circuit. Moreover, for the second OLED pixels in the same row and the corresponding first OLED pixels in the specified row, the first gate driving signal for the first OLED pixels may only include the first scanning signal, and the second gate driving signal for the second OLED pixels may only include the second scanning signal. The first scanning signal is substantially the same as the second scanning signal. Since the first pixel driving circuit is a 2T1C pixel driving circuit, the circuit structure is simple, the footprint is small, and the production is convenient. Similarly, since the second pixel driving circuit is a 2T1C pixel driving circuit, the circuit structure is simple, the footprint is small, and the production is convenient.

In one embodiment, as shown in FIG. 2A, a variable resistor 24 may be connected in series between the second pixel driving circuits 23 corresponding to the rows of the second OLED pixels 14 and the display driving chip 15. The variable resistor can adjust the magnitude of charging current of a parasitic capacitor in the second pixel driving circuit, and thus the pulse width of the second gate driving signal, which is beneficial to make the pulse widths of both the above-mentioned second gate driving signal and first gate driving signal to be substantially the same. Furthermore, the structure is simple, and the footprint is small.

Figure 2B:
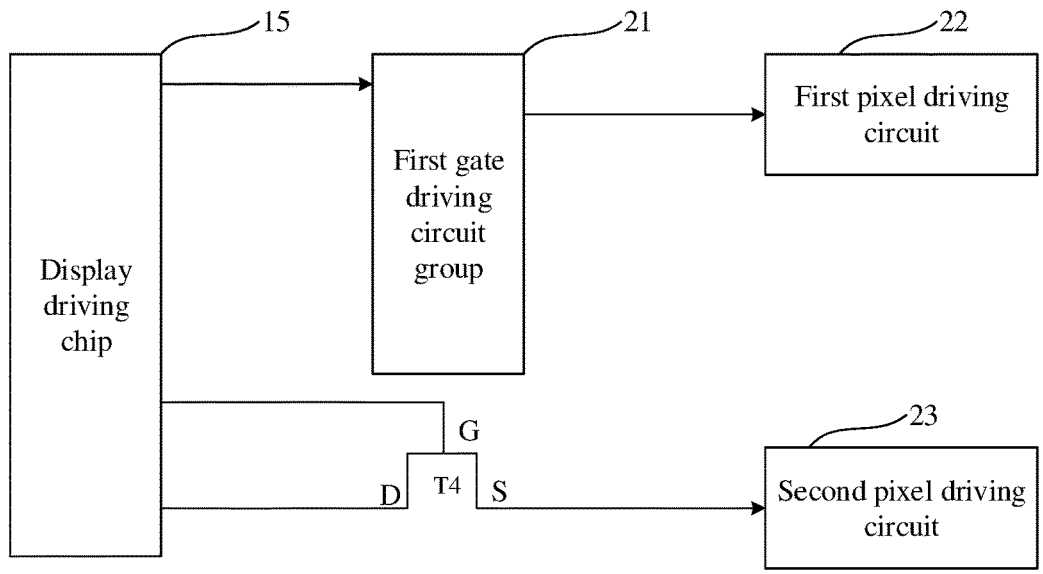
FIG. 2B is a block diagram showing a principle of the gate driving circuit according to another embodiment of the present application.

In one embodiment, as shown in FIG. 2B, the variable resistor is a transistor T4. In one embodiment, a source S of the transistor T4 is connected to the second pixel driving circuits, and a drain D and a gate G thereof are respectively connected to the display driving chip 15. In another embodiment, the drain D of the transistor T4 is connected to the second pixel driving circuits 23, and the source S and the gate G thereof are connected to the display driving chip 15, respectively. Since the transistor is compatible with the manufacturing process of the OLED display panel, the manufacture is easy.

In FIGS. 2A and 2B, when the first gate driving signal only includes the first scanning signal, there may be one signal line between the first gate driving circuit group 21 and the first pixel driving circuits 22. When a first gate driving signal includes the first scanning signal and the first light-emitting control signal, there may be two signal lines between the first gate driving circuit group 21 and the first pixel driving circuits 22. One of the two signal lines is configured to transmit the first scanning signal, the other of the two signal lines is configured to transmit the first light-emitting control signal. Similarly, when the second gate driving signal only includes the second scanning signal, there may be one signal line between the display driving chip 15 and the second pixel driving circuits 23. When the second gate driving signal includes the second scanning signal and the second light-emitting control signal, there may be two signal lines between the display driving chip 15 and the second pixel driving circuits 23. One of the two signal lines is configured to transmit the second scanning signal, and the other of the two signal lines is configured to transmit the second light-emitting control signal.

Figure 7:
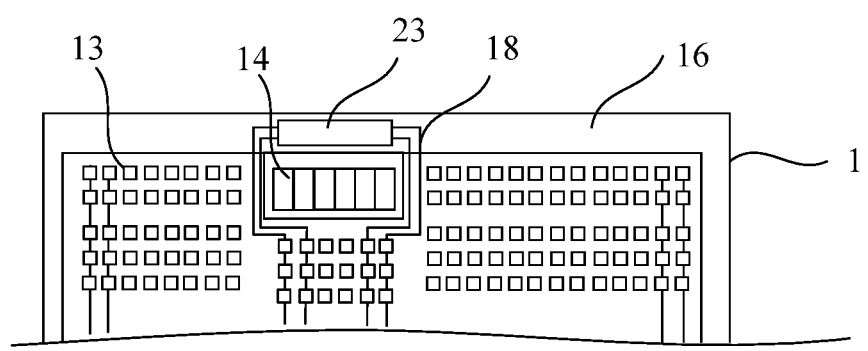
FIG. 7 is a schematic diagram showing wiring of data signal lines of second OLED pixels according to an embodiment of the present application.

In one embodiment, as shown in FIG. 7, the second pixel driving circuits may be arranged in the bezel area 16. Specifically, the second pixel driving circuits may be arranged in a portion of the bezel area 16 which is above the transparent display area 112. This configuration can not only prevent the second pixel driving circuits from affecting the light transmittance of the transparent display area, but also facilitate wiring.

In another embodiment, as shown in FIG. 4, the second pixel driving circuits may be disposed in a transition area 17 between the transparent display area 112 and the non-transparent display area 111. This configuration can not only prevent the second pixel driving circuits from affecting the light transmittance of the transparent display area, but also facilitate wiring. The transition area 17 may not be limited to the shape and position shown in FIG. 4. For example, the transition area 17 may surround the transparent display area 112 on three sides.

In another embodiment, the second pixel driving circuits may be disposed in the non-transparent display area 111. This configuration can not only prevent the second pixel driving circuits from affecting the light transmittance of the transparent display area, but also facilitate wiring.

In one embodiment, as shown in FIG. 1, in the same column, the first pixel driving circuits of the first OLED pixels 13 and the second pixel driving circuits of the second OLED pixels 14 are connected to the same data signal line 18 of the display driving chip 15. The data of all the data signal lines 18 corresponding to the columns of the second OLED pixels 14 and the columns of the first OLED pixels 13 corresponds to the same frame of image in the display area. In the same column, the first pixel driving circuits of the first OLED pixels and the second pixel driving circuits of the second OLED pixels are connected to one data signal line of the display drive chip, and the data of all the data signal lines corresponding to the columns of the second OLED pixels and the columns of the first OLED pixels corresponds to the same frame of image. In this way, the same driving chip can be configured to control the transparent display area and the non-transparent display area to display the same frame of image.

In one embodiment, as shown in FIG. 7, when the second pixel driving circuits 23 are disposed in the bezel area 16, the data signal lines 18 corresponding to the columns of the second OLED pixels 14 can sequentially extend from the display driving chip 15, passing through the non-transparent display area 111 as well as the transition area between the transparent display area 112 and the non-transparent display area, to the corresponding second pixel driving circuits in the bezel area 16. Of course, the data signal lines 18 corresponding to the columns of the second OLED pixels 14 can also extend from the display driving chip 15, passing through the non-transparent display area 111, to the corresponding second pixel driving circuits 23 in the bezel area 16.

When the second pixel driving circuits are arranged in the bezel area, the data signal lines corresponding to the second OLED pixels in columns extend from the display driving chip, passing through the non-transparent display area, the transition area between the transparent display area and the non-transparent display area, to the corresponding second pixel driving circuits in the bezel area; or the data signal lines corresponding to the second OLED pixels in columns extend from the display driving chip, passing through the non-transparent display area, to the corresponding second pixel driving circuits in the bezel area. In this way, the data signal lines 18 do not pass through the transparent display area, which can avoid affecting the light transmittance of the transparent display area.

In one embodiment, as shown in FIG. 1, the second OLED pixels 14 arranged in an array may include one row by multiple columns of second OLED pixels 14. The second gate driving signal for the second OLED pixels 14 in one row by multiple columns may be substantially the same as the first gate driving signal for the first OLED pixels 13 in the first row (i.e., the first OLED pixels in the specified row described above is the first row of the first OLED pixels). Since the arrangement of the second OLED pixels in the transparent display area is one row by multiple columns, the structure is simple, which is easy to prepare and control.

Figure 8:
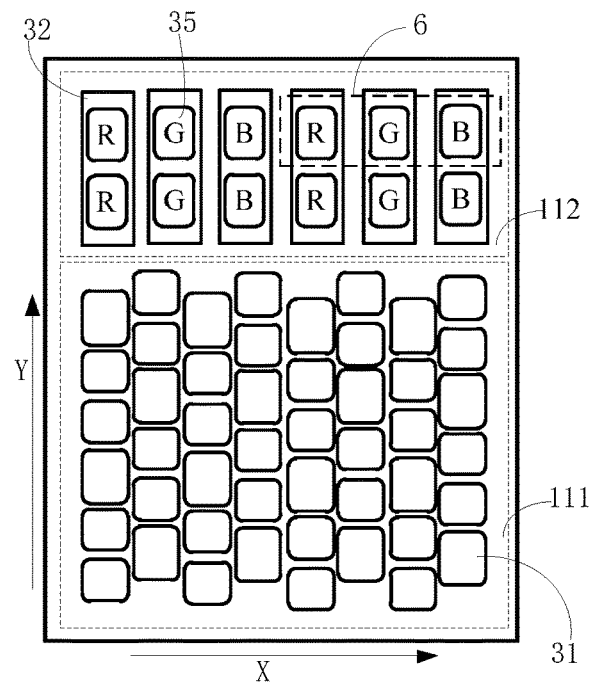
FIG. 8 is a schematic structural diagram showing an arrangement of first OLED pixels and second OLED pixels according to an embodiment of the present application.

In one embodiment, as shown in FIG. 8, the second OLED pixels in one row by multiple columns include sub-pixels of a plurality of colors, and the sub-pixels of different colors in a row form a pixel unit 6. Therefore, the transparent display area can also display an image of multi-colors.

In one embodiment, all columns of second OLED pixels in the transparent display area are sub-pixels of the same color. Since all the second OLED pixels in the columns in the transparent display area are sub-pixels of the same color, the manufacturing process can be simplified.

In one embodiment, as shown in FIG. 8, a column direction described below is a Y direction shown in FIG. 8, and a row direction described below is an X direction shown in FIG. 8. The first OLED pixel may include: a block-shaped first electrode 31, an OLED light-emitting structure, and a second electrode. Each of the second OLED pixels in one row by multiple columns includes: a first electrode 32 extending in the column direction, and an OLED light-emitting structure 35 on the first electrode 32 and a second electrode on the OLED light-emitting structure. Since the first electrode 32 of the second OLED pixel extends in the column direction, the OLED light-emitting structure and the second electrode also extend in the column direction. Therefore, the structure of the second OLED pixel is simplified, which is easy to produce. Furthermore, the number of the boundaries among graphic film layers may be reduced, and the diffraction problem may be mitigated.

In one embodiment, as shown in FIG. 8, the OLED light-emitting structure 35 of the second OLED pixel extends in the column direction on the first electrode 32; or a plurality of OLED light-emitting structures 35 at intervals may be disposed on the second electrode 32. For example, FIG. 8 shows that the light-emitting structures 35 are distributed at intervals on the first electrode 32 along the column direction.

In one embodiment, the plurality of OLED light-emitting structures are spaced apart by a pixel defining layer; or no pixel defining layer is provided between adjacent ones of the plurality of OLED light-emitting structures. Since the plurality of OLED light-emitting structures at intervals are disposed on the first electrode of the second OLED pixel, the plurality of OLED light-emitting structures may be spaced apart by the pixel defining layer. Alternatively, no pixel defining layer is provided between adjacent ones of the plurality of OLED light-emitting structures.

In one embodiment, each of orthographic projections of the first electrodes of the second OLED pixels on a plane where the OLED display panel is located includes one graphic unit or two or more graphic units. The graphic unit is circular, oval, or dumbbell-shaped, gourd-shaped or rectangular. Since the first electrode of the second OLED pixel includes a circular, oval, dumbbell-shaped, gourd-shaped or rectangular structure, interference fringes can be superimposed and canceled, which helps to reduce the diffraction of the transparent display area in the light-transmitting mode, and improve the imaging quality.

In one embodiment, for the first electrode of the second OLED pixel, a ratio of a length in the column direction to a width in the row direction is greater than 20:1.

In one embodiment, the second electrodes of the second OLED pixels are connected to form a planar electrode; or the second electrodes of the first OLED pixels are connected to the second electrodes of the second OLED pixels to form a planar electrode. Since the second electrodes of the second OLED pixels are connected to form the planar electrode, or the second electrodes of the first OLED pixels and the second electrodes of the second OLED pixels are connected to form the planar electrode, the production process can be simplified.

In one embodiment, the first electrodes and the OLED light-emitting structures of the second OLED pixels in each column extend in the column direction in a middle section of the transparent display area; or extend downward from the top portion of the transparent display area to the middle section or the bottom portion; or extend from the middle section to the bottom portion.

Figure 9:
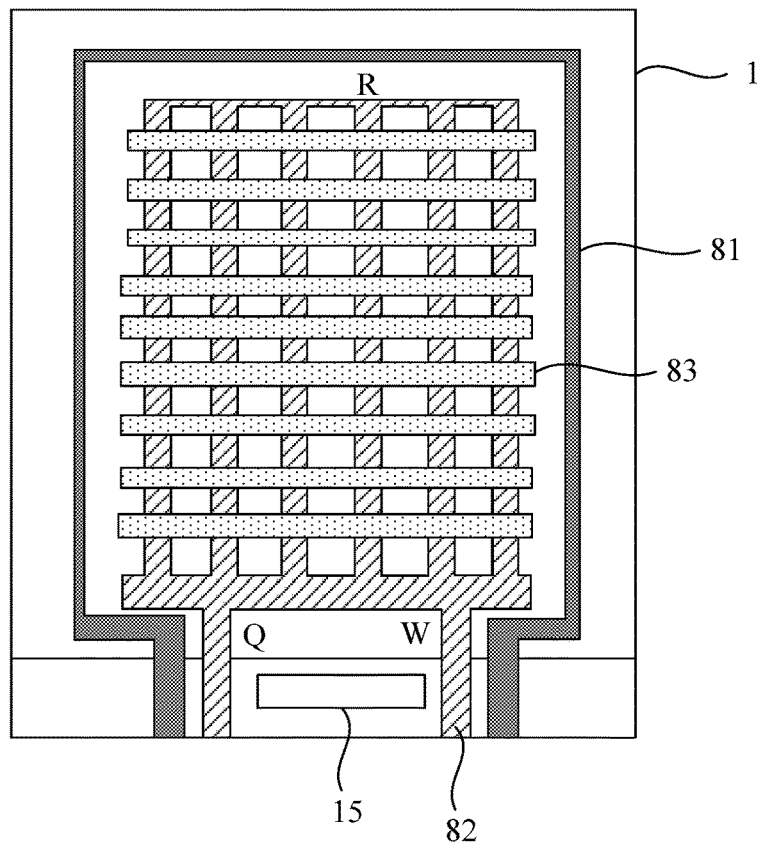
FIG. 9 is a schematic structural diagram of an OLED display panel.

Moreover, as an aspect ratio of the display area of the full screen gradually increases, the bezel area becomes narrower and narrower, thereby making a voltage drop (IR drop) of the power signal to become more and more serious, which affects the brightness uniformity. As shown in FIG. 9, the power line of the display panel includes power lines 81, 82 and 83. Among them, the power line 81 is a low-level power line, and the power line 82 and the power line 83 are high-level power lines. As shown in FIG. 9, proximal ends of the two power lines 82 to an input end of the power are points Q and W, respectively, and a distal end of the power lines 82 to the input end of the power is a point R. As a distance from the two points Q and W to the point R becomes larger, the voltage drop of the power signal becomes more and more large. Therefore, the embodiments of the present application further provide a technical solution for solving this technical problem, which is specifically as follows.

Figure 10:
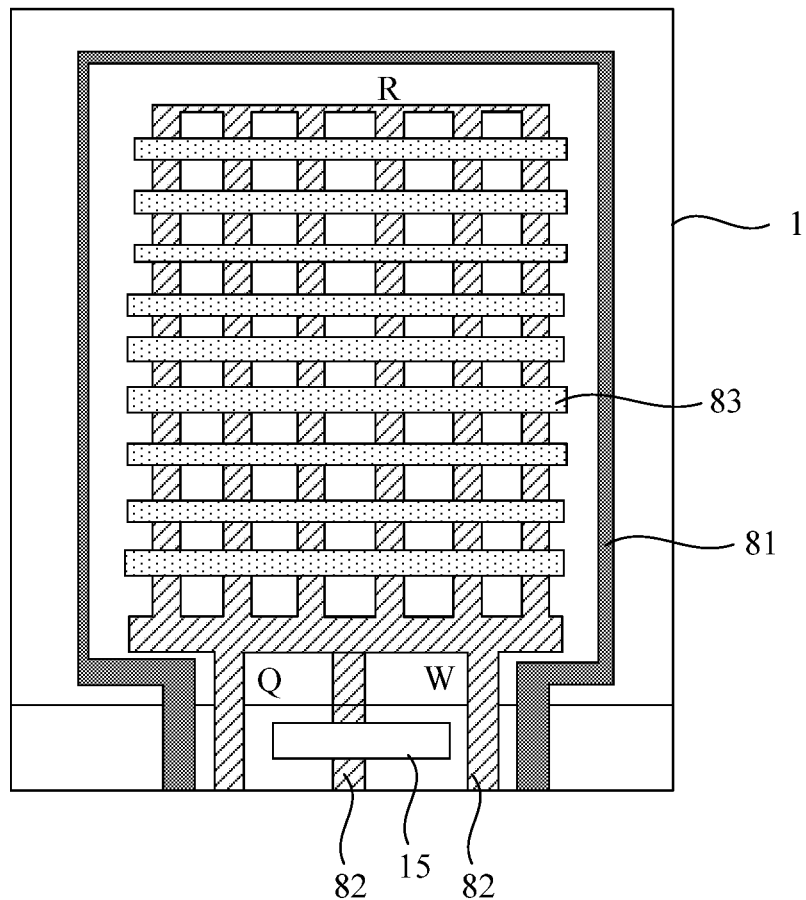
FIG. 10 is a schematic structural diagram of an OLED display panel according to an embodiment of the present application.

In one embodiment, as shown in FIG. 10, the OLED display panel 1 may further include a plurality of power lines 82, and the power lines 82 are configured to supply a power supply voltage to the first OLED pixels 13 and the second OLED pixels 14.

Figure 11:
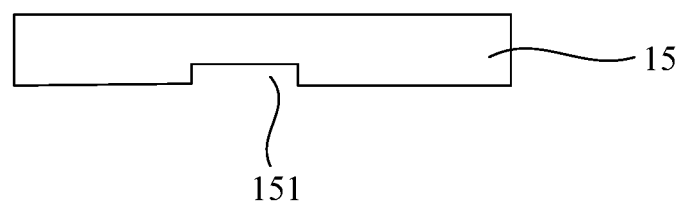
FIG. 11 is a schematic cross-sectional view of a display driving chip according to an embodiment of the present application.

As shown in FIG. 11, a first power signal channel 151 is provided in a lower part of the display driving chip 15. At least one of the plurality of power lines 82 is electrically connected to the first OLED pixels 13 and the second OLED pixels 14 through the first power signal channel 151. The first power signal channel is provided in the lower part of the display driving chip, and at least one power line 82 passes through the first power signal channel and is electrically connected to the first OLED pixels and the second OLED pixels. In this way, it is beneficial to increase the number of power lines 82 connected to the pixels in the display area, and the current through each power line 82 can be reduced when the power supply voltage supplies a constant current, thereby reducing the voltage drop in each power line 82, which can increase the uniformity of the display brightness of the display area.

In one embodiment, as shown in FIG. 10, the at least one power line includes one power line, for example, one power line 82.

Figure 12:
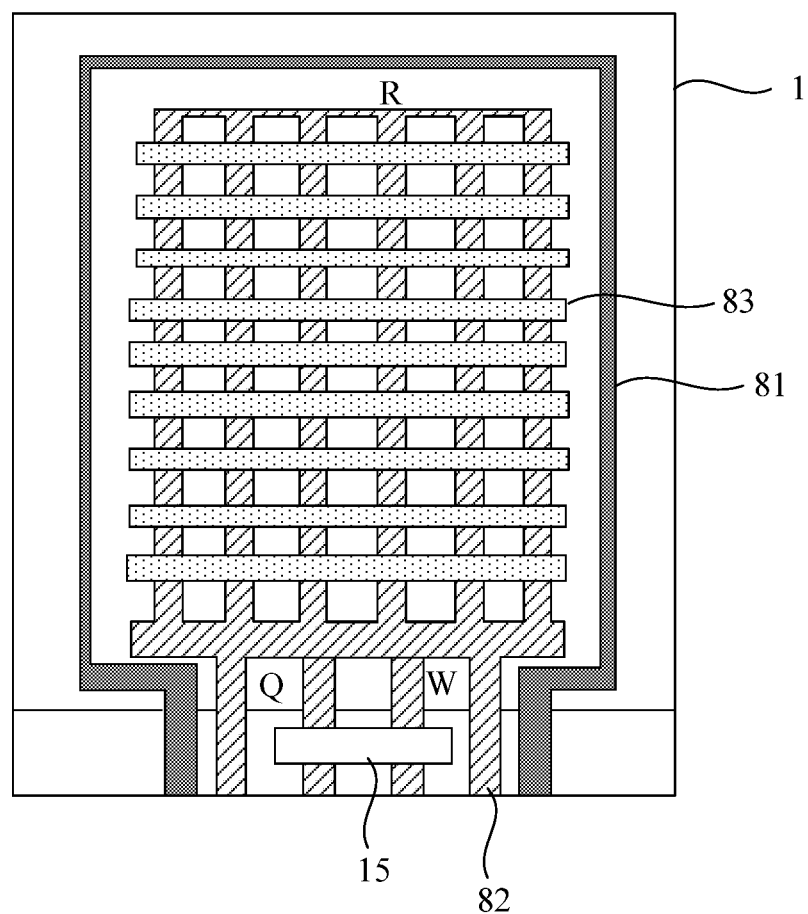
FIG. 12 is a schematic structural diagram of an OLED display panel according to another embodiment of the present application.

In one embodiment, as shown in FIG. 12, the at least one power line passing through the first power signal channel 151 includes two power lines. The number of the first power signal channels 151 can also be two. The two power lines respectively pass through the corresponding first power signal channel 151. When the number of power lines passing through the first power signal channel is two, the voltage drop in each power line can be further reduced, and the uniformity of the display brightness of the display area can be improved.

In the embodiment of the present application, since the number of power lines passing through the first power signal channel may be one or two, the variety of implementation manners is realized.

In one embodiment, one or more redundant pins may be provided on the display driving chip 15. The one or more redundant pins are connected in parallel with the power line(s) passing through the first power signal channel(s). Since the one or more redundant pins are disposed on the display driver chip, and the one or more redundant pins are connected in parallel with the power line(s) 82 passing through the first power signal channel(s), not only the resistance of the power line(s) can be reduced, but also support can be provided via the one or more redundant pins during welding.

Figure 13:
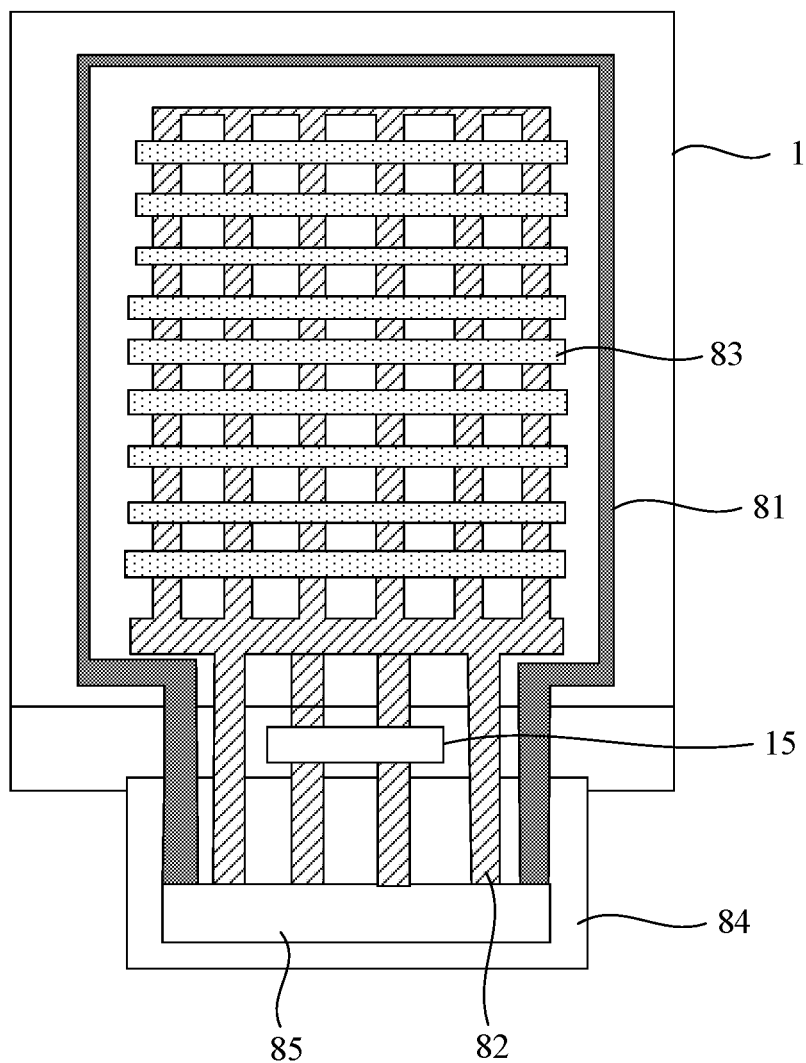
FIG. 13 is a schematic structural diagram of an OLED display panel according to yet another embodiment of the present application.

In one embodiment, as shown in FIG. 13, a flexible printed circuit board 84 is arranged on the OLED display panel 1. The display driving chip 15 is electrically connected to the flexible printed circuit board 84. The flexible printed circuit board 84 is provided with a plurality of second power signal channels. The second power signal channels are disposed in one-to-one correspondence with the plurality of power lines 82. That is, each power line 82 can pass through one corresponding second power signal channel. A power chip 85 is also electrically connected to the flexible printed circuit board 84. The second power signal channels are provided on the flexible printed circuit board, and the power lines 82 pass through the second power signal channels and are electrically connected to the first OLED pixels and the second OLED pixels. This configuration is beneficial to increase the number of power lines 82 connected to the pixels in the display area, and the current on each power line 82 can be reduced when the power supply voltage supplies the constant current, thereby reducing the voltage drop in each power line 82, which can improve the uniformity of the display brightness of the display area.

Figure 14:
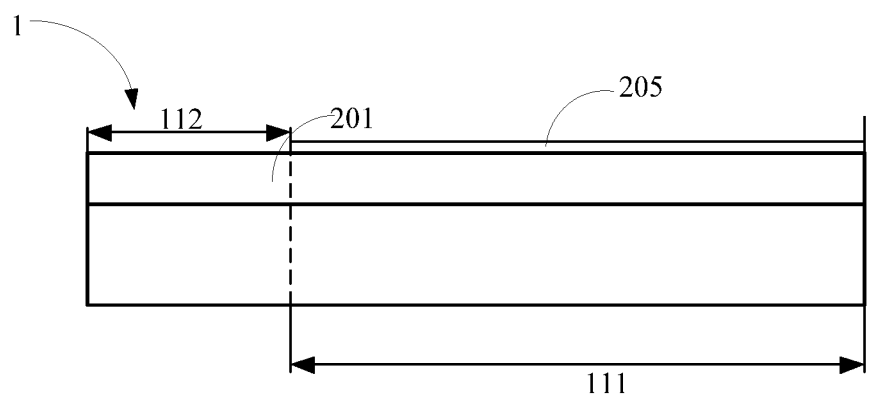
FIG. 14 is a schematic structural diagram of an OLED display panel according to still another embodiment of the present application.

A display panel 1 provided by an embodiment of the present application, as shown in FIG. 14, further includes an encapsulation layer 201. The encapsulation layer 201 is encapsulated on a side of the OLED display panel 1 that is away from a substrate of the OLED display panel, and a light sensing component may be disposed under the transparent display area.

In one embodiment, at least a part of the transparent display area 112 of the OLED display panel 1 is surrounded by the non-transparent display area 111.

In one embodiment, the OLED display panel 1 includes a polarizer 205, and the polarizer 205 is disposed on the encapsulation layer 201. The polarizer 205 covers the non-transparent display area 111 and does not cover the transparent display area 112. Since the polarizer 205 can eliminate ambient light entering the display panel and then being reflected out of the display panel, interference of the ambient light in the normal display of the display panel can be eliminated.

Figure 15:
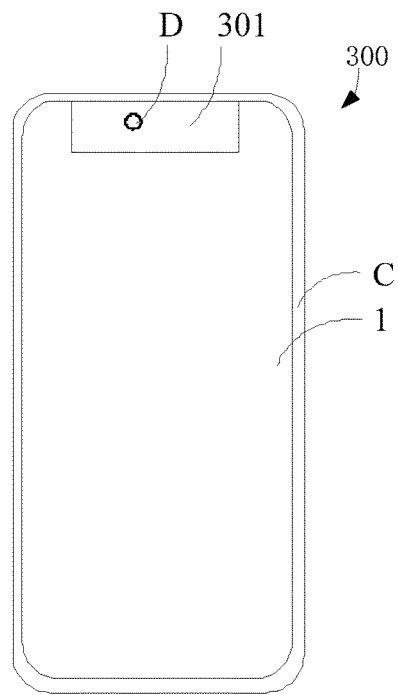
FIG. 15 is a schematic diagram showing a structure of a display device according to an embodiment of the present application.

As shown in FIG. 15, an embodiment of the present application further provides a display device 300, which includes: a device body C and the display panel 1 described in any of the foregoing embodiments.

The device body C has a component area 301, and the display panel 1 covers the device body C. The component area 301 is located beneath the transparent display area, and the component area includes a light sensing component D that emits or collects light through the transparent display area.

In one embodiment, the light sensing component D includes at least one of the following: a camera, a light sensor, or a light emitter.

In an embodiment, the OLED display panel 1 may further include the display driving chip 15.

Figure 16:
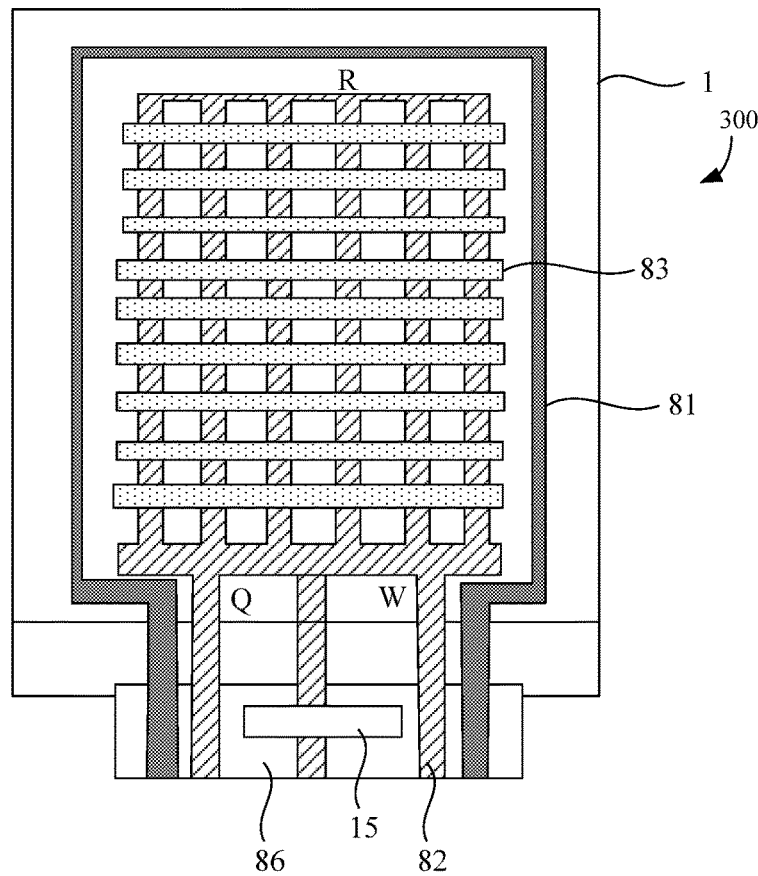
FIG. 16 is a schematic structural diagram of a display device according to an embodiment of the present application.

In another embodiment, as shown in FIG. 16, the OLED display panel 1 of the display device 300 further includes a chip on film 86, and the display driving chip 15 is disposed on the chip on film 86.

In another embodiment, the display device may further include a flexible printed circuit board. The flexible printed circuit board is located on the chip on film. The chip on film is included in the OLED display panel. The display driving chip 15 is arranged on the chip on film, and the display driving chip 15 is electrically connected to the flexible printed circuit board.

In an embodiment, as shown in FIG. 13, when the OLED display panel 1 includes a plurality of power lines 82, the display device further includes a power chip 85. The power lines 82 are electrically connected to the power chip 85.

In one embodiment, when the OLED display panel 1 further includes the flexible printed circuit board 84, the flexible printed circuit board 84 is provided with a plurality of power signal channels, the plurality of power signal channels are disposed in one-to-one correspondence with the plurality of power lines 82, and the plurality of power signal channels are electrically connected to the power chip 85.

In the embodiment, the first OLED pixels and the second OLED pixels horizontally aligned can perform displaying synchronously, and the light-emitting brightness thereof is substantially the same, thereby realizing the synchronous display of the non-transparent display area and the transparent display area, reducing or even avoiding the split-screen phenomenon occurred in areas on both sides of the boundary line between the non-transparent display area and the transparent display area. At the same time, the voltage drop in each power line can be reduced, and the uniformity of the display brightness of the display area can be improved.

The display device in this embodiment may be any product or component with a display function, such as electronic paper, mobile phone, tablet computer, television, notebook computer, digital photo frame, navigator, etc.

In the drawings, the sizes of layers and areas may be exaggerated for clarity of illustration. It can be understood that when an element or layer is referred to as being "on" another element or layer, it can be directly on another element or an intervening layer may exist. In addition, it should be further understood that when an element or layer is referred to as being "under" another element or layer, it can be directly under another element, or more than one intervening layer or element may exist. In addition, it should be further understood that when a layer or element is referred to as "between" two layers or two elements, it can be the only layer between the two layers or two elements, or more than one intermediate layer or element may further exist. Similar reference signs designate similar elements throughout the description.

In this application, the terms "first" and "second" are only used for descriptive purposes, and cannot be construed as indicating or implying relative importance. The term "a plurality" refers to two or more, unless specifically defined otherwise.

After considering the specification and practicing the disclosure disclosed herein, those skilled in the art will easily think of other embodiments of the present application. This application is intended to cover any variations, uses, or adaptations of the present application following general principles of the present application and include the common general knowledge or conventional technical means in the art without departing from the present application. The description and embodiments can be shown as illustrative only, and the true scope and spirit of the application are indicated by the following claims.

The invention claimed is:

1. An OLED display panel, comprising:
a display area comprising:
   a non-transparent display area comprising first OLED pixels arranged in an array, and the first OLED pixels arranged in an array being drivable in an active mode; and
   a transparent display area, a boundary line being disposed between the non-transparent display area and the transparent display area, the transparent display area comprising second OLED pixels arranged in an array; when the second OLED pixels arranged in an array being driven, the transparent display area performing a display function; when the second OLED pixels arranged in an array not being driven, the transparent display area performing a light transmission function; and the second OLED pixels arranged in an array being drivable in an active mode;
a display driving chip; and
a first gate driving circuit group, connected to a first group of gate driving signal channels of the display driving chip;
wherein first pixel driving circuits corresponding to the first OLED pixels in each row are respectively connected to the first gate driving circuit group, second pixel driving circuits corresponding to the second OLED pixels in each row are respectively connected to a second group of gate driving signal channels of the display driving chip,
the display driving chip is configured to output a first set of clock signals through the first group of gate driving signal channels, and the first gate driving circuit group is configured to convert the first set of clock signals into a first gate driving signal for the first pixel driving circuits corresponding to the first OLED pixels in each row;
the display driving chip is further configured to output second gate driving signal for the second pixel driving circuits corresponding to the second OLED pixels in each row through the second group of gate driving signal channels; and
for a same frame of image, a pulse width of the second gate driving signal for the second OLED pixels in each row is substantially as same as a pulse width of the first gate driving signal for the first OLED pixels in a specified row, and intersection points of the boundary line and a pixel row where the first OLED pixels in the specified row are located falls within a range of intersection points of the boundary line and a corresponding pixel row of the second OLED pixels,
wherein the second OLED pixels arranged in an array comprise second OLED pixels in one row by a plurality of columns; the second gate driving signal for the second OLED pixels in the one row by the plurality of columns and first gate driving signal for the first OLED pixels in a first row are the same; the second OLED pixels arranged in the one row by the plurality of columns comprise sub-pixels of a plurality of colors, and ones of the sub-pixels which are of different colors in a row form a pixel unit; or the second OLED pixels in the one row by the plurality of columns in the transparent display area comprise sub-pixels of a same color.

2. The OLED display panel according to claim 1, wherein for the second OLED pixels in the row and the corresponding first OLED pixels in the specified row, the first gate driving signal for the first OLED pixels in the specified row comprises a first scanning signal and a first light-emitting control signal; and
the second gate driving signal for the second OLED pixels in the row comprises a second scanning signal and a second light-emitting control signal;
wherein the first scanning signal and the second scanning signal are substantially same, and the first light-emitting control signal is substantially a same as the second light-emitting control signal.

3. The OLED display panel according to claim 1, wherein, each of the first pixel driving circuits comprises an nT1C pixel driving circuit, and the nT1C pixel driving circuit comprises at least one first switching transistor configured to control a corresponding one of the first OLED pixels to emit light, wherein n is a positive integer greater than 2;
each of the second pixel driving circuits comprises an mT1C pixel driving circuit, and the mT1C pixel driving circuit comprises at least one second switching transistor configured to control a corresponding one of the second OLED pixels to emit light, wherein m is a positive integer greater than 2.

4. The OLED display panel according to claim 1, wherein for the second OLED pixels in the row and the corresponding first OLED pixels in the specified row, the first gate driving signal for the first OLED pixels comprises a first scanning signal, and the second gate driving signal for the second OLED pixels comprises a second scanning signal; wherein the first scanning signal is substantially a same as the second scanning signal.

5. The OLED display panel according to claim 1, wherein a variable resistor is connected in series between the second pixel driving circuits corresponding to the second OLED pixels in each row and the display driving chip.

6. The OLED display panel according to claim 5, the variable resistor is a transistor; a source of the transistor is connected to the second pixel driving circuits, and a drain and a gate of the transistor are respectively connected to the display driving chip; or, the drain of the transistor is connected to the second pixel driving circuits, and the source and the gate of the transistor are respectively connected to the display driving chip.

7. The OLED display panel according to claim 1, wherein the second pixel driving circuits are arranged in the non-transparent display area, a bezel area, or a transition area between the transparent display area and the non-transparent display area of the OLED display panel.

8. The OLED display panel according to claim 7, wherein when the second pixel driving circuits are disposed in the bezel area, data signal lines corresponding to the columns of the second OLED pixels sequentially extend from the display driving chip, passing through the non-transparent display area as well as the transition area between the transparent display area and the non-transparent display area, to the second pixel driving circuits in the bezel area; or the data signal lines corresponding to the columns of the second OLED pixels extend from the display driving chip, passing through the non-transparent display area, to the second pixel driving circuits in the bezel area.

9. The OLED display panel according to claim 1, wherein the display driving chip comprises a plurality of data signal lines, in a same column, first pixel driving circuits of the first OLED pixels and second pixel driving circuits of the second OLED pixels are connected to a same one of the data signal lines;

data of the data signal lines corresponding to each column of the second OLED pixels and each column of the first OLED pixels corresponds to a same frame of image in the display area.

10. The display panel according to claim 1, wherein each of the first OLED pixels comprises a block-shaped first electrode, a first OLED light-emitting structure, and a second electrode; each of the second OLED pixels in one row by the plurality of columns comprises a third electrode extending in a column direction, at least one second OLED light-emitting structure on the third electrode, and a fourth electrode on the at least one second OLED light-emitting structure;

the at least one second OLED light-emitting structure of each of the second OLED pixels extends in the column direction on the third electrode; or the at least one second OLED light-emitting structure comprises a plurality of second OLED light-emitting structures at intervals disposed on the third electrode of the second pixel.

11. The OLED display panel according to claim 10, wherein an orthographic projection of the third electrode of each of the second OLED pixels on a plane where the OLED display panel is located comprises one graphic unit, or two or more graphic units.

12. The OLED display panel according to claim 10, wherein for the third electrode of each of the second OLED pixels, a ratio of a length in the column direction to a width in a row direction is greater than 20:1; and fourth electrodes of the second OLED pixels are connected together to form a planar electrode; or second electrodes of the first OLED pixels as well as the fourth electrodes of the second OLED pixels are connected together to form a planar electrode.

13. The OLED display panel according to claim 10, wherein the third electrode and the OLED light-emitting structure of each of the second OLED pixels extend along the column direction in a middle section of the transparent display area; or extend downward from a top portion of the transparent display area to the middle section or a bottom portion of the transparent display area; or extend from the middle section to the bottom portion.

14. The OLED display panel according to claim 1, wherein the OLED display panel further comprises a plurality of power lines, and the power lines are configured to supply a power supply voltage to the first OLED pixels and the second OLED pixels;

at least one first power signal channel is disposed in a lower part of the display driving chip; at least one of the power lines passes through the at least one first power signal channel and is electrically connected to the first OLED pixels and the second OLED pixels.

15. The OLED display panel according to claim 14, wherein the display driving chip comprises one or more redundant pins which are connected in parallel with the at least one of the power lines which passes through the at least one first power signal channel; or the OLED display panel further comprises a flexible printed circuit board electrically connected to the display driving chip; the flexible printed circuit board is provided with a plurality of second power signal channels, and the plurality of second power signal channels are disposed in one-to-one correspondence with the plurality of power lines.

16. The OLED display panel according to claim 1, further comprising:

an encapsulation layer encapsulated on a side of the OLED display panel that is away from a substrate of the OLED display panel, and the transparent display area on the OLED display panel being at least partially surrounded by the non-transparent display area; and a polarizer disposed on the encapsulation layer, wherein the polarizer covers the non-transparent display area and does not cover the transparent display area.

17. A display device, comprising:

a device body comprising a component area; and the OLED display panel according to claim 1, the OLED display panel covering the device body;

wherein the component area is located beneath the transparent display area, and the component area comprises a light sensing component that emits or collects light through the transparent display area.

18. The display device according to claim 17, wherein the OLED display panel of the display device further comprises a chip on film, and the display driving chip is disposed on the chip on film; or the display device further comprises a flexible printed circuit board, the OLED display panel of the display device further comprises the chip on film, the flexible printed circuit board is located on the chip on film; the display driving chip is arranged on the chip on film, and the display driving chip is electrically connected to the flexible printed circuit board.

19. The display device according to claim 17, wherein when the OLED display panel comprises a plurality of power lines, the display device further comprises a power chip, and the plurality of power lines are electrically connected to the power chip.

\* \* \* \* \*